US006977816B2

(12) United States Patent
Lee et al.

(10) Patent No.: US 6,977,816 B2
(45) Date of Patent: Dec. 20, 2005

(54) HEAT SINK MOUNTING ASSEMBLY

(75) Inventors: Hsieh Kun Lee, Tu-chen (TW); WanLin Xia, Shenzhen (CN); Tao Li, Shenzhen (CN); Jin Song Feng, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 9 days.

(21) Appl. No.: 10/848,446

(22) Filed: May 17, 2004

(65) Prior Publication Data
US 2004/0228095 A1 Nov. 18, 2004

(30) Foreign Application Priority Data
May 16, 2003 (TW) .............................. 92209056 U

(51) Int. Cl.[7] .............................................. H05K 7/20
(52) U.S. Cl. ...................... 361/704; 361/707; 257/718; 174/16.3; 165/80.3
(58) Field of Search ................................ 361/704, 707, 361/709, 719; 165/80.3, 185; 174/16.3; 257/718, 257/727; 24/457–459; 248/505, 510, 316.7

(56) References Cited
U.S. PATENT DOCUMENTS

| | | | | |
|---|---|---|---|---|
| 5,464,054 A | | 11/1995 | Hinshaw et al. | |
| 5,542,468 A | * | 8/1996 | Lin | ............................. 165/80.3 |
| 5,933,326 A | * | 8/1999 | Lee et al. | ..................... 361/704 |
| 5,982,620 A | * | 11/1999 | Lin | ............................. 361/704 |
| 6,108,207 A | * | 8/2000 | Lee | ............................. 361/704 |
| 6,111,752 A | * | 8/2000 | Huang et al. | ................ 361/704 |
| 6,208,518 B1 | * | 3/2001 | Lee | ............................. 361/704 |
| 6,229,705 B1 | * | 5/2001 | Lee | ............................. 361/704 |
| 6,400,572 B1 | * | 6/2002 | Wu | ............................. 361/704 |
| 6,462,945 B2 | * | 10/2002 | Sloan et al. | ................. 361/687 |
| 6,483,703 B2 | * | 11/2002 | Hsu | ............................. 361/704 |
| 2002/0126451 A1 | * | 9/2002 | Hsu | ............................. 361/704 |

FOREIGN PATENT DOCUMENTS

| | | |
|---|---|---|
| TW | 114670 | 6/1989 |
| TW | 474425 | 9/2000 |
| TW | 465907 | 11/2001 |
| TW | 510640 | 11/2002 |

* cited by examiner

Primary Examiner—Boris Chervinsky
(74) Attorney, Agent, or Firm—Wei Te Chung

(57) ABSTRACT

A heat sink mounting assembly includes a socket (90) having first and second side, a retaining clip (10) cooperating with the socket to sandwich a heat sink (70) therebetween. A pair of ears (92) is formed at the first and second sides of the socket. The retaining clip includes a pressing body (11) having first and second ends, a first leg (14) extending from the first end thereof and engaging with one ear, a spring (50) attached to the pressing body, and a second leg (30) attached to the second end thereof and biased by the spring. When the second leg is pressed down toward the socket, the spring biases the second leg upwardly, so that the second leg is resiliently engaged with the other ear. Thus, the heat sink is secured between the socket and the retaining clip.

20 Claims, 11 Drawing Sheets

HEAT SINK MOUNTING ASSEMBLY

BACKGROUND OF THE INVENTION

1. Field of the Invention

The present invention relates generally to mounting apparatuses, and more particularly to a mounting assembly for readily mounting a heat sink onto a heat-generating component such as a Central Processing Unit (CPU).

2. Prior Art

With the continuing development of computer electronics technology, new electronic packages such as the latest CPUs can perform more and more functions. Heat generated by these modern electronic packages has increased commensurately. Therefore, bigger and heavier heat sinks are becoming increasingly necessary to efficiently remove the heat from the electronic packages.

A conventional heat sink assembly is disclosed in U.S. Pat. No. 5,464,054. In this kind of heat sink assembly, a clip made from a single metal wire is positioned in a groove of a heat sink for mounting the heat sink to an electronic package. Two resilient arms extend from opposite ends of the clip in directions substantially perpendicular to each other. A distal end of each arm is bent to form a hook engaging in a corresponding receiver formed on a frame or socket that holds the electronic package, thereby fastening the heat sink to the electronic package. However, selecting a wire clip with an appropriate diameter can be problematic. If the wire is too thin, the clip cannot provide a sufficient spring force to hold the heat sink, and the heat sink is prone to be displaced when the assembly is subjected to vibration or shock. If the wire is too thick, an unduly large force is required to engage the clip into the corresponding receivers. Additionally, a tool is generally required for installation or removal of the clip, which makes these processes excessively time consuming. Furthermore, the tool is liable to slip during use, which can cause damage to other components adjacent the electronic package. All these difficulties reduce the efficiency of assembly in mass production facilities. Reduced efficiency is translated into increased costs.

FIG. 11 shows a retaining clip for cooperating with a socket to fasten a heat sink to a heat-generating device such as a CPU. The retaining clip comprises a pressing body 1. A first leg 11 extends from an end of the pressing body 1, for engaging with a first ear formed on the socket. An operation lever 2 is pivotably mounted to an opposite end of the pressing body 1 by a first mounting shaft 71. A second leg 2 is pivotably mounted to an end of the operation lever 2 that is near the pressing body 1 by a second mounting shaft 72, for engaging with a second ear formed on the socket. When the operation lever 2 is rotated to a locked position in which the operation lever 2 abuts the pressing body, the second leg 2 is driven upwardly to engage with the second ear of the socket, thereby enabling the pressing body to exert an urging force pressing the heat sink toward the CPU.

During operation, the urging force of the pressing body 1 is a result of an overall deformation of the retaining clip caused by rotation of the operation lever 2. However, the retaining clip is usually configured such that the operation lever 2 can be only stably maintained in a fixed position, that is the locked position, to enable the press body 1 to urge the heat sink to the CPU. Therefore, rotation of the operation lever 2 can only cause a very limited range of deformations of the retaining clip, which provides a very limited range of urging forces. The retaining clip thus generally can be hardly applied to heat sinks having different specifications.

In addition, the operation lever 2 is usually configured to have a considerable length for ease of operation. A large operation space is required. This militates the trend of electrical products becoming smaller and smaller.

SUMMARY OF THE INVENTION

Accordingly, an object of the present invention is to provide a heat sink mounting assembly which can provide a wide range of urging forces to urge a heat sink to an electronic package such as a CPU.

Another object of the present invention is to provide a heat sink mounting assembly which needs a relative small operation space.

To achieve the above-mentioned objects, a heat sink mounting assembly in accordance with a preferred embodiment of the present invention comprises a socket, a retaining clip cooperating with the socket for sandwiching a heat sink therebetween. The socket has a first side, and an opposite second side. A pair of ears is formed at the first and second sides of the socket respectively. The retaining clip comprises a pressing body having first and second ends, a first leg extending from the first end of the pressing body, a spring attached to the pressing body, and a second leg attached to the second end of the pressing body and biased by the spring. The first leg engages with one of the ears of the socket. When the second leg is pressed down toward the socket, the spring biases the second leg upwardly, so that the second leg is resiliently engaged with the other ear of the socket. Thus, the heat sink is secured between the socket and the retaining clip.

According to an alternative embodiment, the heat sink mounting apparatus comprises a connecting body rotatably attached to the second end of the pressing body, and biased by the spring. The second leg is rotatably attached to the connecting body. When the second leg is pressed down toward the socket, the spring biases the connecting body upwardly. The second leg is then driven upwardly by the connecting body, to resiliently engaged with the other ear of the socket.

Other objects, advantages and novel features of the present invention will be drawn from the following detailed description of the preferred embodiment of the present invention with attached drawings, in which:

DESCRIPTION OF THE PREFERRED EMBODIMENTS

Figure 1:
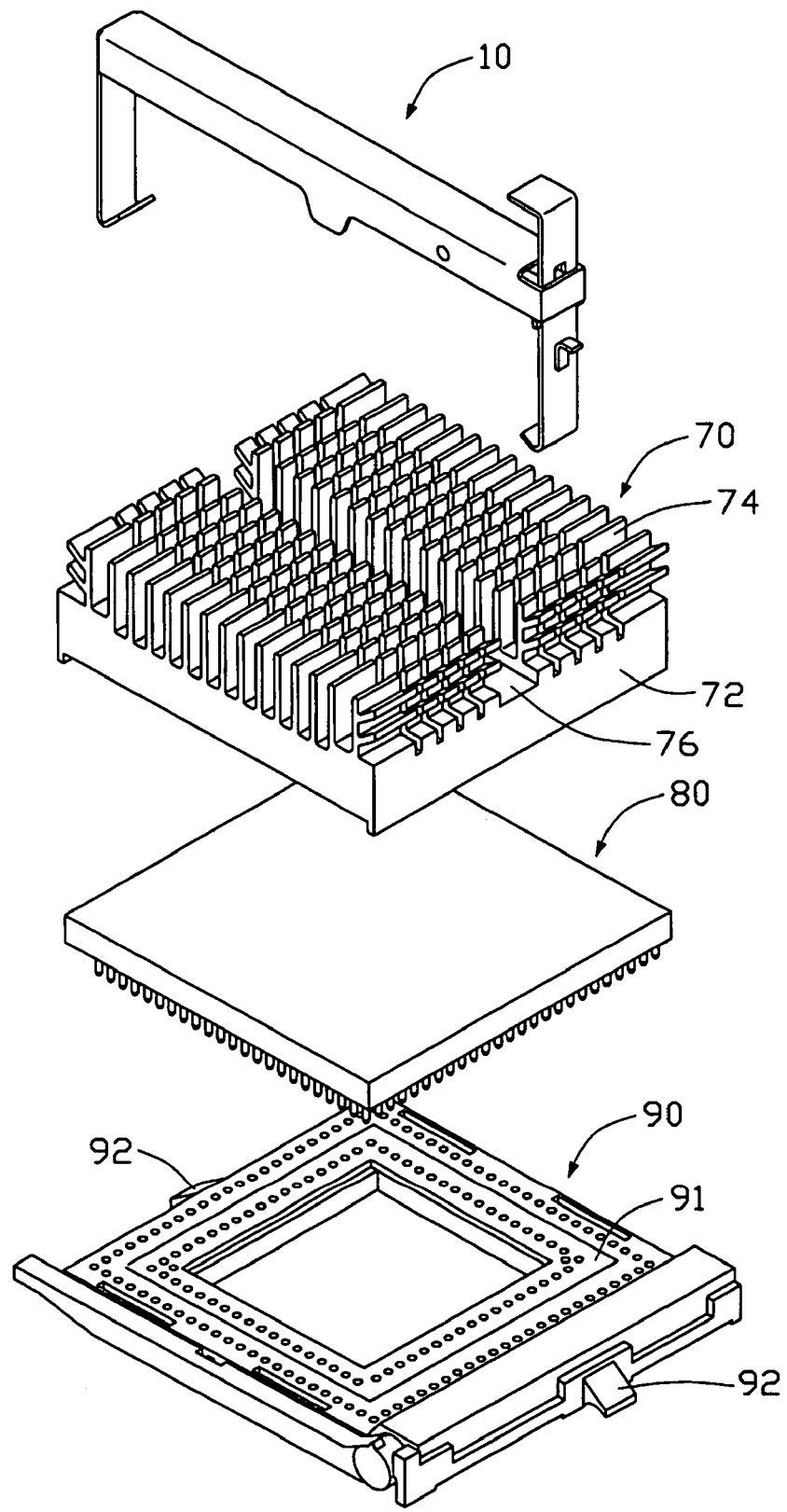
FIG. 1 is an exploded, isometric view of a heat sink mounting assembly in accordance with the preferred embodiment of the present invention, together with a heat sink and a CPU, the heat sink mounting assembly comprising a CPU socket, and a retaining clip for cooperating with the CPU socket.

FIG. 1 illustrates a heat sink mounting assembly in accordance with the preferred embodiment of the present invention, together with a heat-generating device such as a CPU 80, and a heat sink 70 for attaching on the CPU 80. The heat sink 70 comprises a base 72 for thermally contacting a top surface of the CPU 80, and a plurality of cooling fins 74 extending upwardly from the base 72. The heat sink 70 defines a mounting channel 76 extending transversely between the cooling fins 74.

The heat sink mounting assembly comprises a CPU socket 90 for attaching to a printed circuit board (not shown), and a retaining clip 10 cooperating with the CPU socket 90 to attach the heat sink 70 on the CPU 80.

The CPU socket 90 comprises a mounting portion 91 for mounting the CPU 80 thereon, and two ears 92 formed at opposite sides of the mounting portion 91 respectively. The mounting portion 91 defines a plurality of insertion hole, for receiving a plurality of terminals of the CPU 80.

Figure 2:
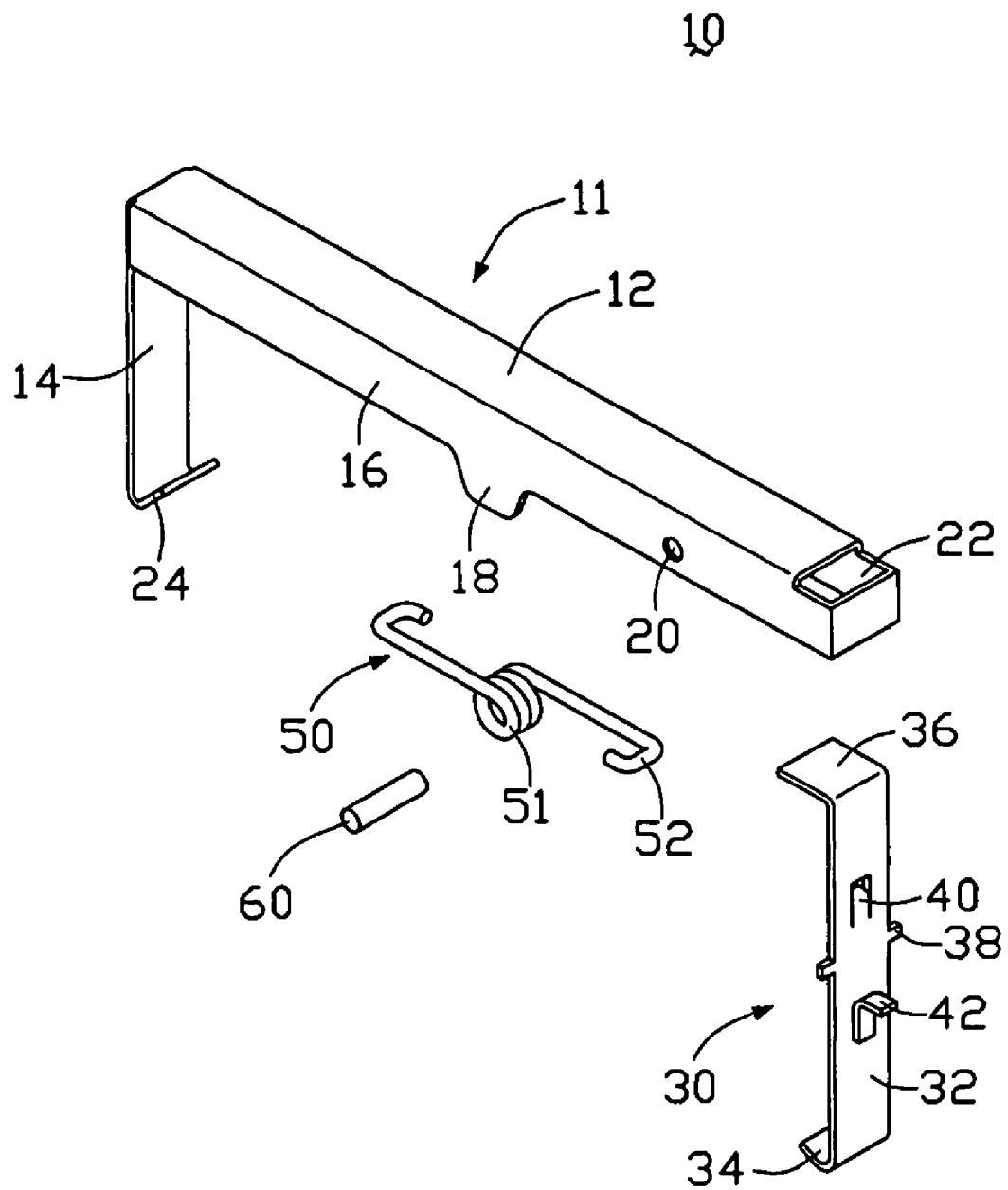
FIG. 2 is an enlarged, exploded view of the retaining clip of the heat sink mounting assembly of FIG. 1.

Referring also to FIG. 2, each retaining clip 10 comprises an elongated pressing body 11, a first leg 14 extending perpendicularly and downwardly from a first end of the pressing body 11, a second leg 30 attached to an opposite second end of the pressing body 11, and a biasing member such as a spring 50 attached to the pressing body 11 by a mounting shaft 60. The pressing body 11 comprises a horizontal top wall 12, and a pair of vertical sidewalls 16 extending downwardly from opposite long sides of the top wall 12. The top wall 12 and the sidewalls 16 cooperatively define a channel (not labeled) therebetween, for receiving the spring 50 therein. The spring 50 comprises a coil 51, and two end catches 52 extending from the coil 51 in opposite directions. A pair of mounting holes 20 is defined in the sidewalls 16 respectively, near the second end of the pressing body 11. The mounting holes 20 are opposite each other across the channel. An abutting tab 184 extends downwardly from a middle of each sidewall 16. The first leg 14 extends downwardly from a first end of the top wall 12. A distal end of the first leg 14 is bent inwardly and upwardly to form a first hook 24. An opening 22 is defined in an opposite second end of the top wall 12. The second leg 30 comprises a medial portion 32, a second hook 34 bent inwardly and upwardly from a bottom end of the medial portion 32, and an operation tab 36 extending inwardly and perpendicularly from a top end of the medial portion 32. A pair of protrusions 38 is outwardly formed from opposite edges of the medial portion 32 respectively. The medial portion 32 is stamped inwardly and downwardly to form a latch 40 (as better seen in FIG. 4), above the protrusions 38. A handle 42 is attached to the medial portion 32, below the protrusions 38. The handle 42 may alternatively be formed by stamping the medial portion 32.

Figure 3:
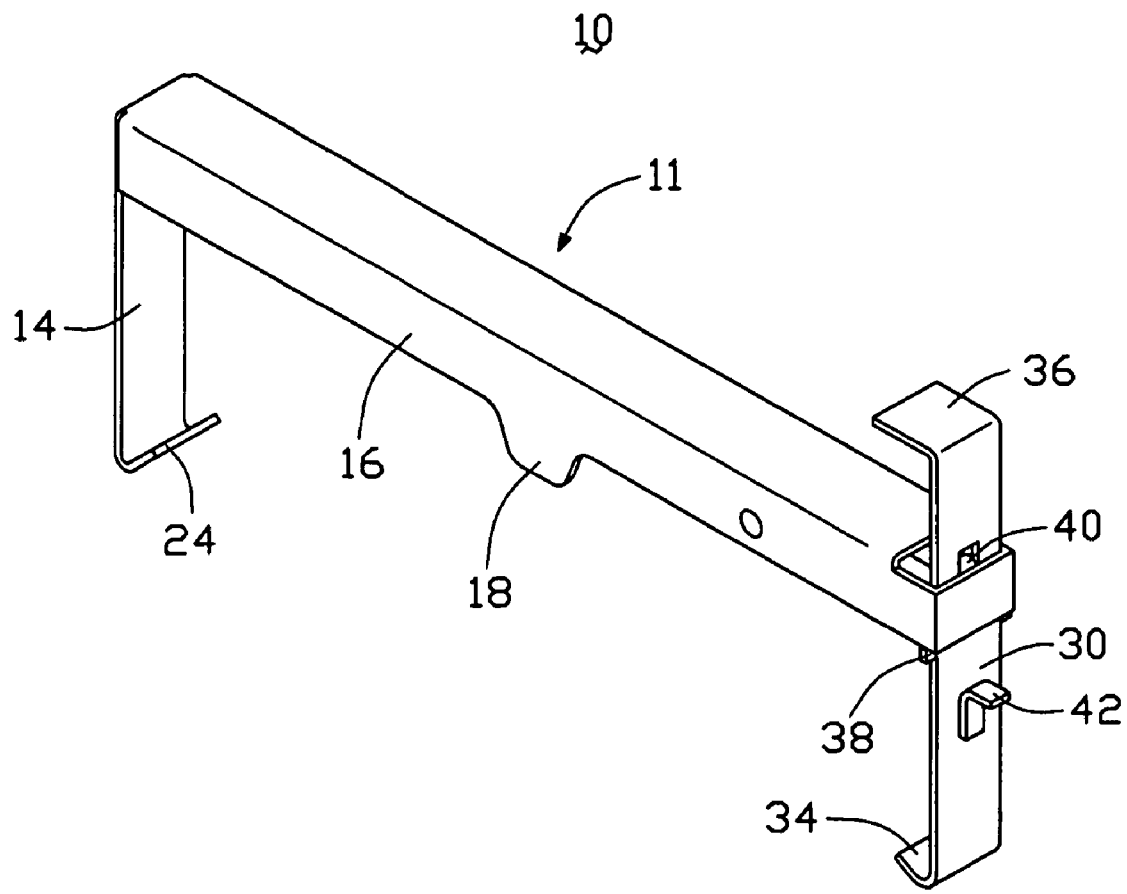
FIG. 3 is an assembled view of FIG. 2.
Figure 4:
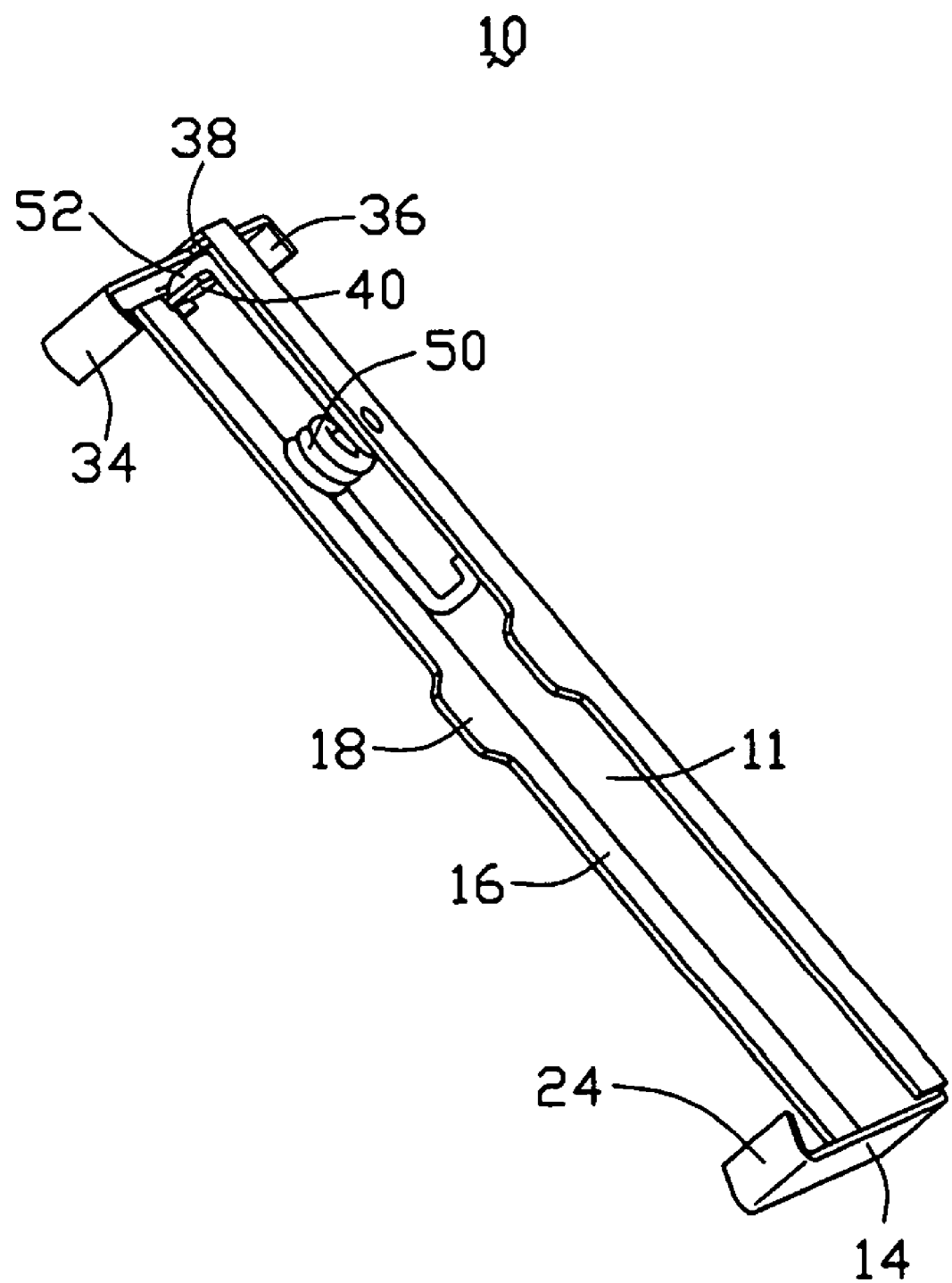
FIG. 4 is similar to FIG. 3, but viewed from another aspect.

Referring to FIGS. 3 and 4, in assembly of the retaining clip 10, the spring 50 is placed in the channel of the pressing body 11, with the coil 51 of the spring 50 aligned with the mounting holes 20 of the pressing body 11. The mounting shaft 60 is in turn extended through one of the mounting holes 20, the coil 51, and the other of the mounting holes 20, thereby attaching the spring 50 in the channel. The second leg 30 is extended through the opening 22 of the top wall 12 from below the pressing body 11, until the protrusions 38 engage with bottom sides of the sidewalls 16 respectively. One of the end catches 52 of the spring 50 abuts a bottom side of the top wall 12, and the other of the end catches 52 engages with the latch 40 of the second leg 30, whereby the second leg 30 is biased by the spring 50. Thus, the retaining clip 10 is fully assembled.

Figure 5:
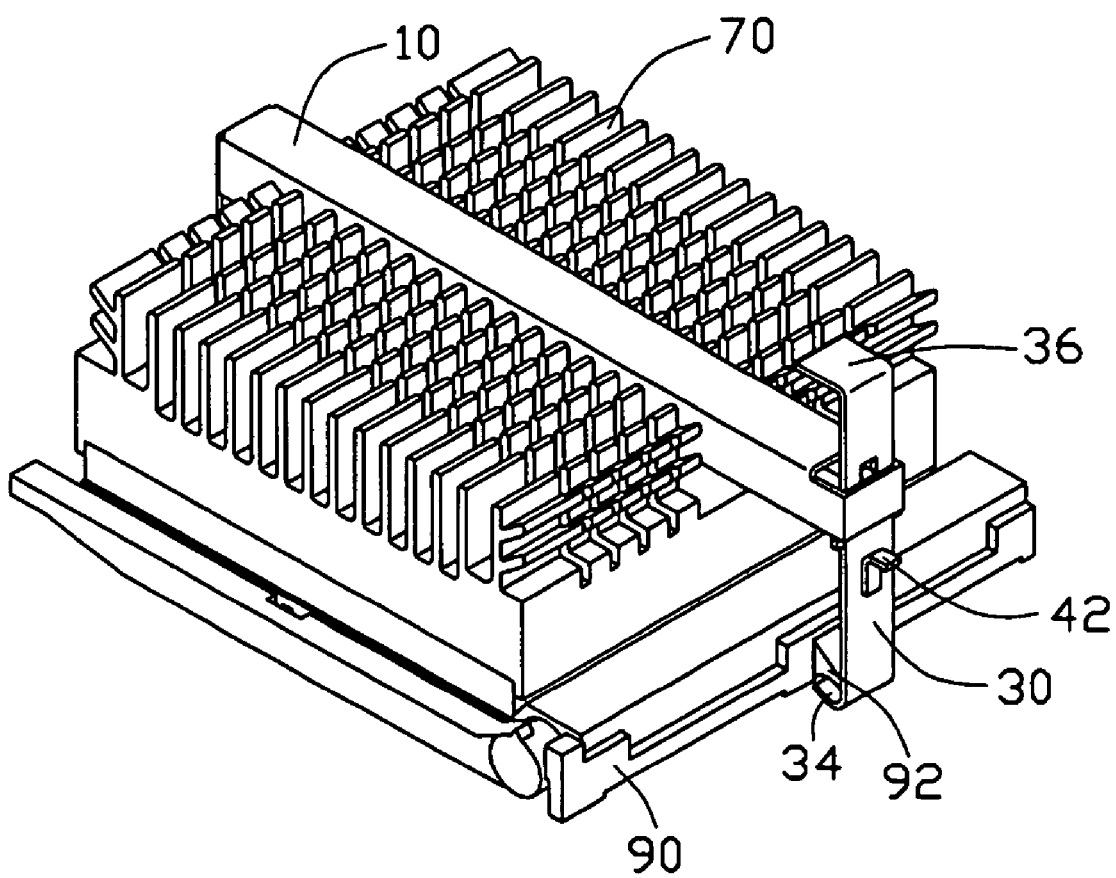
FIG. 5 is an assembled view of FIG. 1.

Referring also to FIG. 5, in assembly of the heat sink mounting assembly, the CPU 80 is mounted on the mounting portion 91 of the CPU socket 90. The heat sink 70 is placed on the CPU 80. The base 72 of the heat sink 70 is in loose contact with the top surface of the CPU 80.

The retaining clip 10 is then placed in the mounting channel 76 of the base 72. The abutting tab 18 of the pressing body 11 is loosely engaged with the base 72. The first hook 24 of the first leg 14 of the retaining clip 10 is loosely engaged with one of the ears 92 of the CPU socket 90. The operation tab 36 and the handle 42 of the second leg 30 are pressed down toward the other of the ears 92 of the CPU socket 90, thereby compressing the coil 51 of the spring 50. When the second hook 34 of the second leg 30 reaches just beyond the other of the ears 92, the second leg 30 is released. The second leg 30 is moved upwardly by decompression of the coil 51 of the spring 50, the first and second hooks 24, 34 are thereby resiliently engaged with the ears 92 respectively. Simultaneously, the abutting tab 18 resiliently urges the base 72 of the heat sink 70. The heat sink 70 is thus firmly secured on the CPU 80 by the retaining clip 10.

To remove the heat sink 70, the operation tab 36 and the handle 42 are pressed downwardly and pulled outwardly, thereby compressing the coil 51 of the spring 50. The second leg 30 is released. The second leg 30 is then moved upwardly by decompression of the coil 51. The first and second hooks 242, 262 are disengaged from the ears 92 of the CPU socket 90. The retaining clip 10 is removed from the heat sink 70. The heat sink 70 is then readily removed from the CPU 80.

In the heat sink mounting assembly of the present invention, the retaining clip 10 is engaged with the heat sink 70 and the CPU socket 90 merely by pressing the operation tab 36 and the handle 42 of the second leg 30, and the retaining unit 10 is detached from the heat sink 70 and the CPU socket 90 merely by pressing and pulling the operation tab 36 and the handle 42 of the second leg 30. No tools or other actuation means are required, and a large space is not required. The heat sink mounting assembly provides easy and convenient operation. In addition, the urging force of the retaining clip 10 is generated by the spring 50. Therefore, the retaining clip 10 can provide a wide range of urging forces for heat sinks having different specifications.

In the preferred embodiment of the present invention, only one retaining clip 10 is used. Two or more retaining clips 10 may be simultaneously used to obtain a larger urging force according to need.

Figure 10:
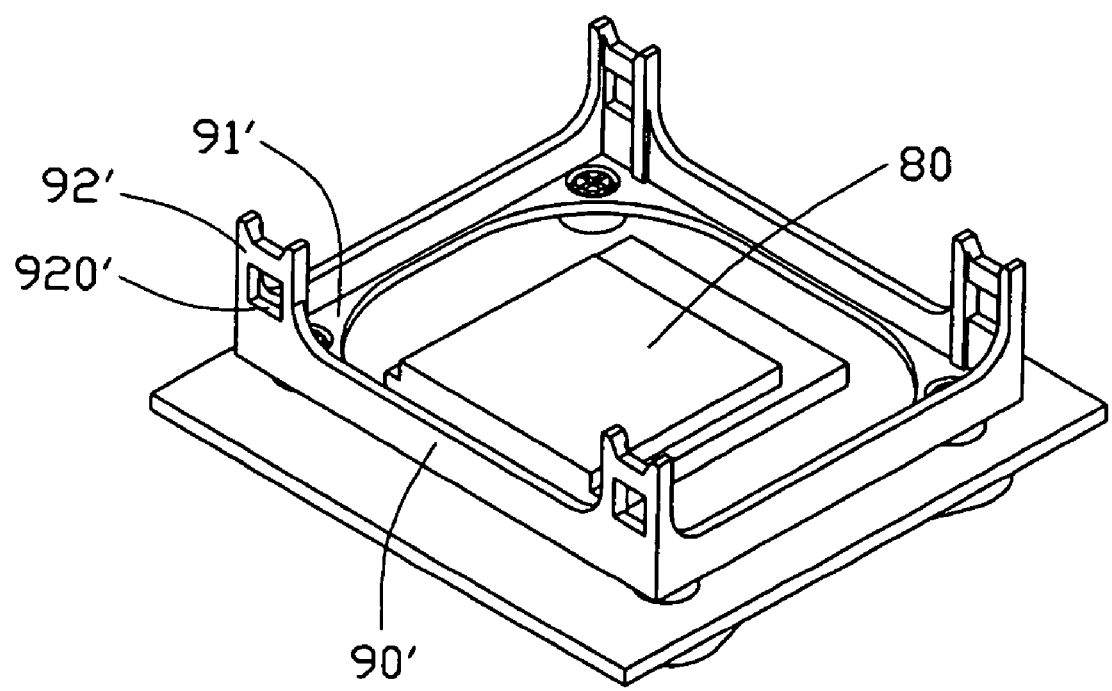
FIG. 10 is an isometric view of a retention module of a heat sink mounting assembly in accordance with an alternative embodiment.
Figure 11:
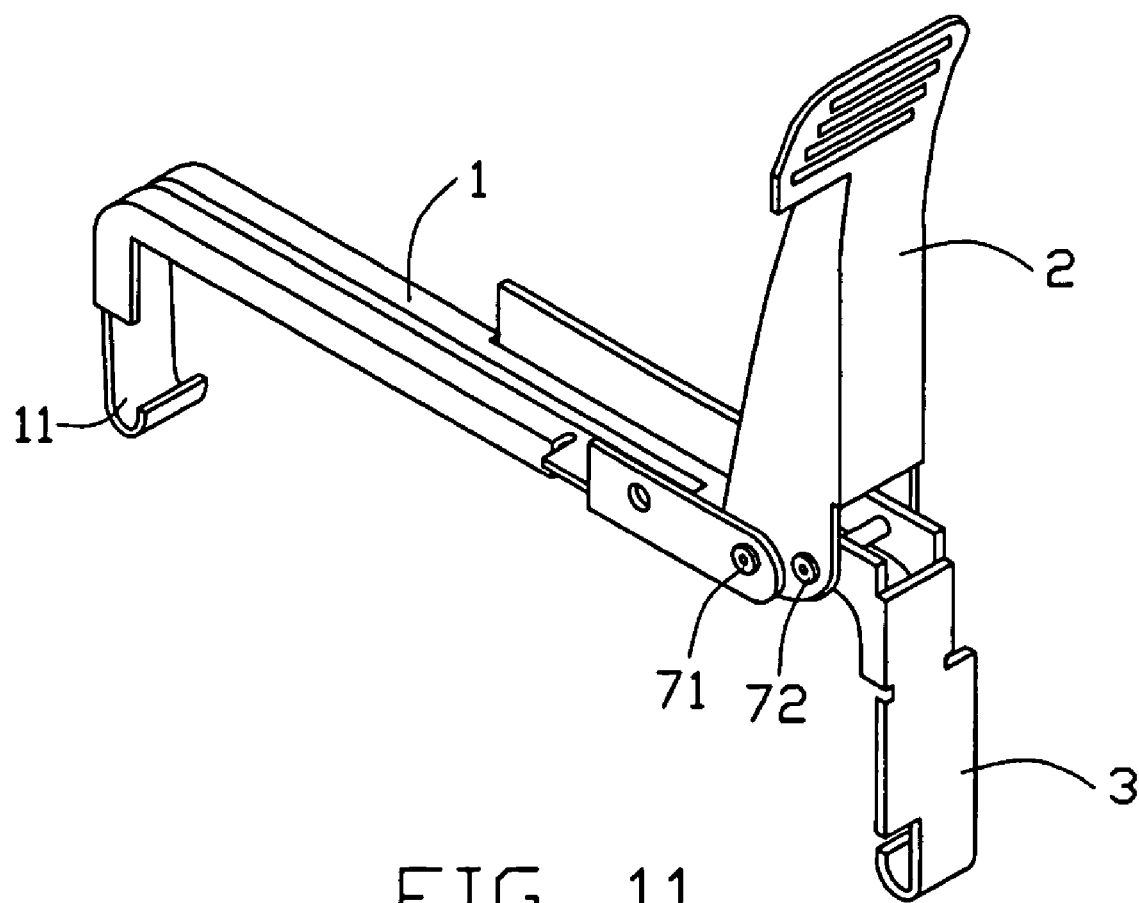
FIG. 11 is an isometric view of a conventional retaining clip.

In addition, in the preferred embodiment, the CPU socket 90 comprises two ears 92 at the opposite sides thereof. The first and second legs 14, 30 of the retaining clip 10 respectively have first and second hooks 24, 34 engaging with corresponding ears 92. Referring to FIG. 10, in an alternative embodiment, the retaining clip 10 may instead cooperate with other retention device such as a retention module 90' within which the CPU 80 is mounted. The retention module 90' comprises a base frame 91' surrounding the CPU 80, and four columns 92' extending upwardly from four corners of the base frame 91' respectively. The four columns 92' cooperatively define a space therebetween for receiving the heat sink 70 therein. Each column 92' defines a locking hole 920' therein for engagingly receiving corresponding first and second hooks 24, 34 of the retaining clip 10.

Figure 6:
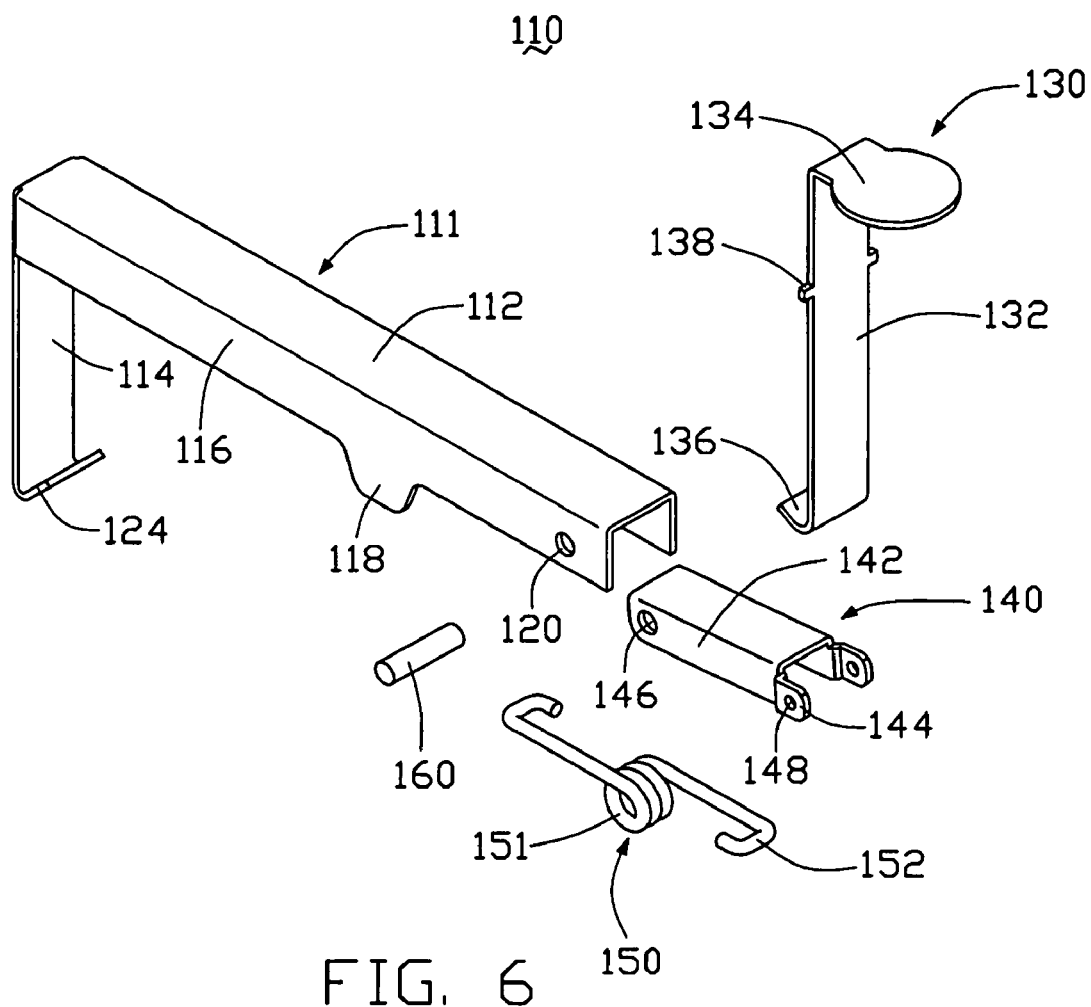
FIG. 6 is an exploded, isometric view of a retaining clip of a heat sink mounting assembly in accordance with an alternative preferred embodiment of the present invention.

FIG. 6 illustrates a retaining clip 110 of a heat sink mounting assembly according to a further alternative embodiment of the present invention. The retaining clip 110 comprises an elongated pressing body 111, a first leg 114 extending downwardly from a first end of the pressing body 111, a connecting body 140 rotatably attached to an opposite second end of the pressing body 111, a biasing member such as a spring 150 attached to the pressing body 111 for biasing the connecting body 140, and a second leg rotatably mounted to a free end of the connecting body 140.

The pressing body 111, the first leg 114, and the spring 150 of the further alternative embodiment are similar to the pressing body 11, the first leg 14 and the spring 50 of the preferred embodiment. That is, the pressing body 111 comprises a top wall 112, and two sidewalls 116 each forming an abutting tab 118 and a mounting hole 120. The first leg 114 comprises a first hook 124. The spring 151 comprises a coil 151, and two end parts 152.

The connecting body 140 comprises a top plate 141, and two spaced parallel side plates 142 extending downwardly from opposite long sides of the top plate 141. A mounting hole 146 is defined in a first end of each side plate 142. A mounting tab 144 extends from an opposite second end of each side plate 142. A mounting aperture 148 is defined in each mounting tab 144.

The second leg 130 comprises a medial portion 132, a second hook 136 extending upwardly and inwardly from a bottom end of the medial portion 132, an operation tab 134 extending outwardly and perpendicularly from a top end of the medial portion 132, and a pair of protrusions 138 extending outwardly from opposite sides of the medial portion 132.

Figure 7:
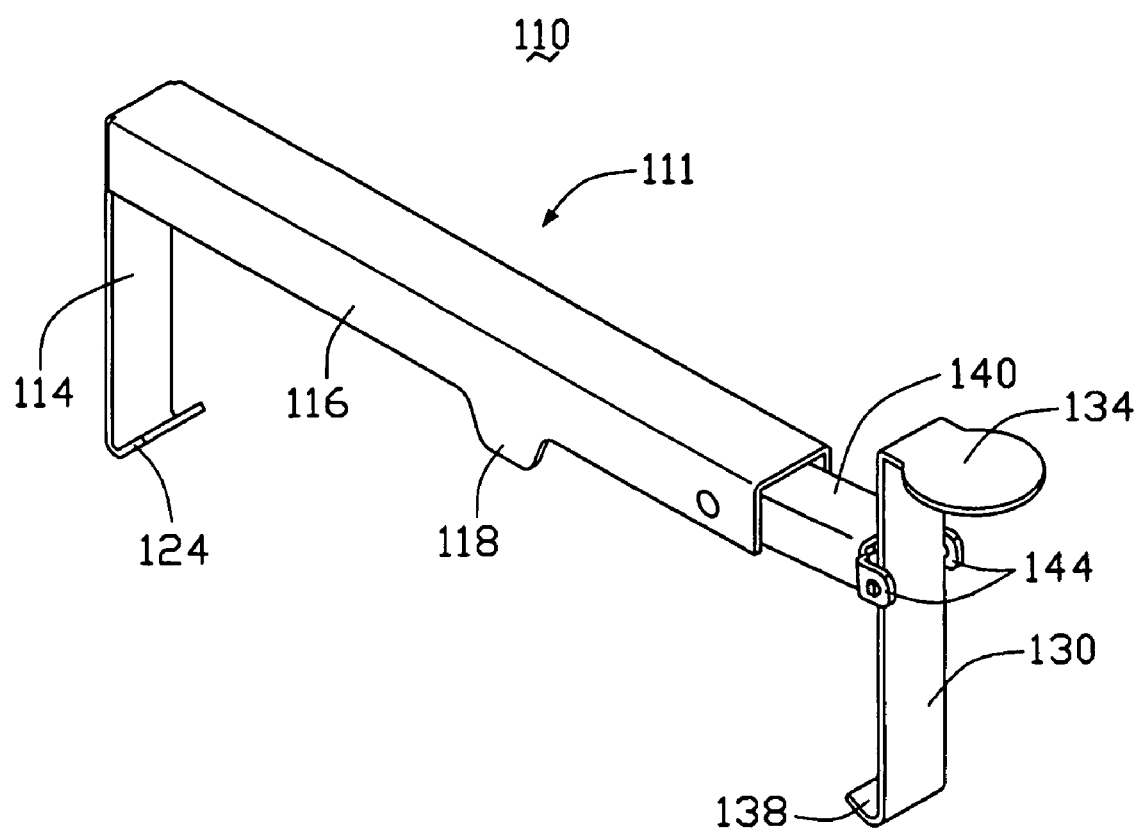
FIG. 7 is an assembled view of FIG. 6.
Figure 8:
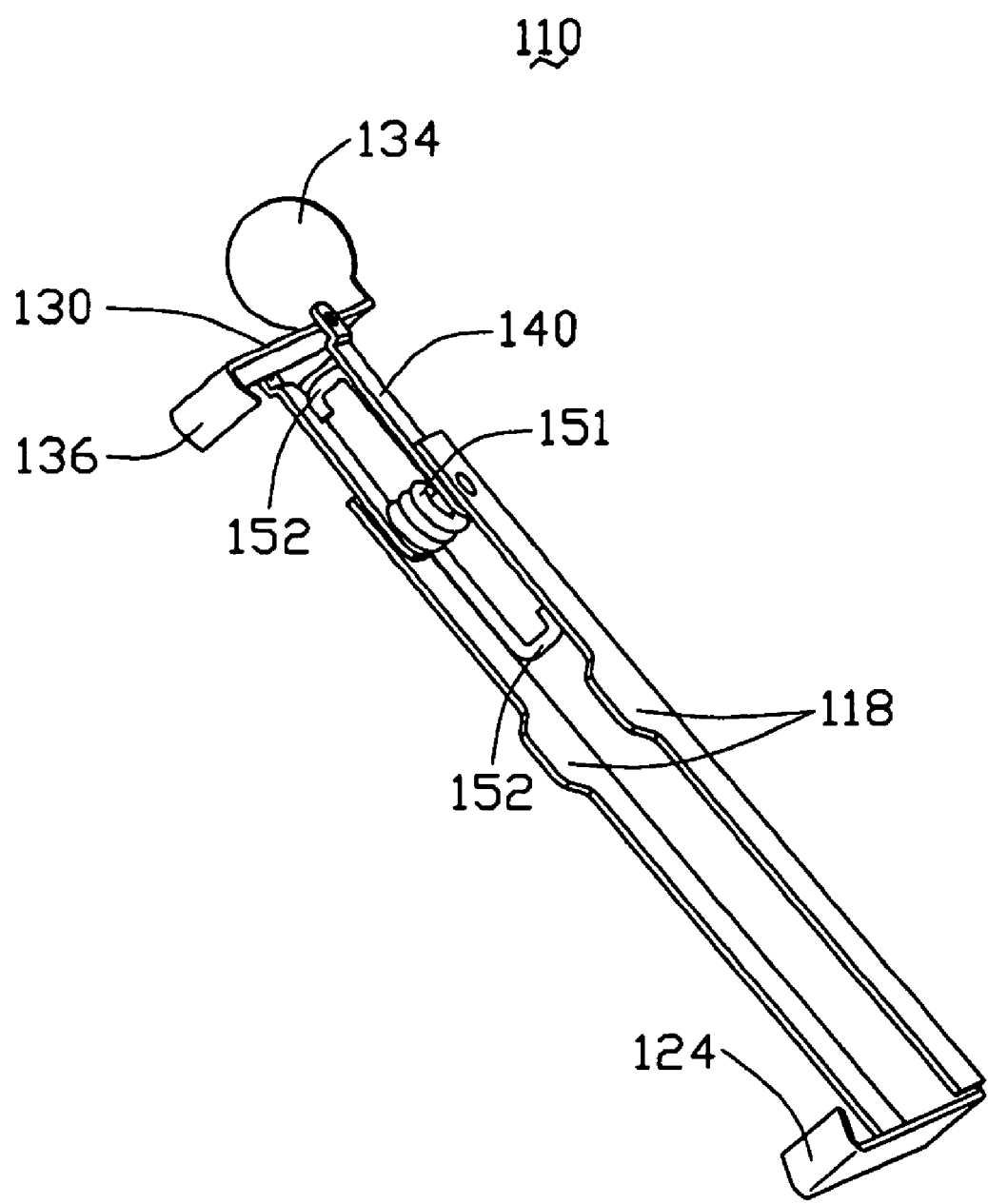
FIG. 8 is similar to FIG. 7, but view from another aspect.
Figure 9:
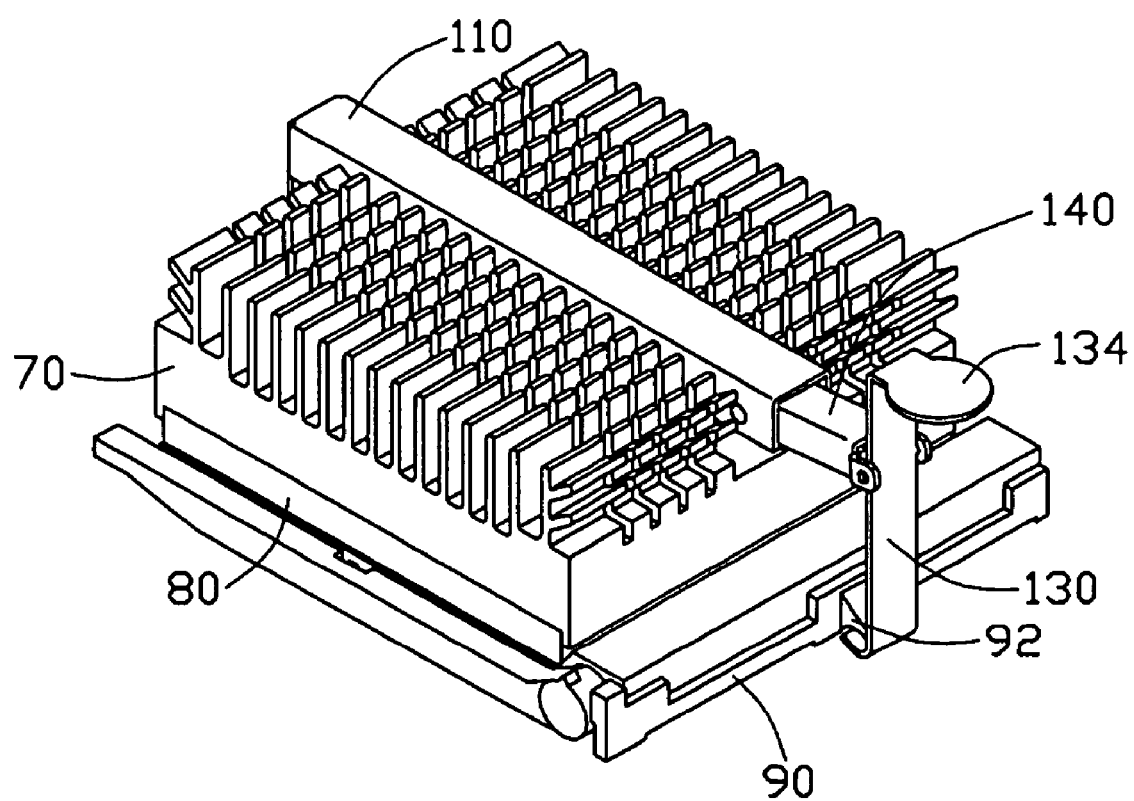
FIG. 9 is an assembled view of a heat sink mounting assembly of FIG. 7, together with the heat sink and the CPU.

Referring to FIGS. 7 and 8, in assembly of the retaining clip 110, the first end of the connecting body 140 is inserted into the second end of the pressing body 111. The spring 150 is placed in the pressing body 111 and the connecting body 140, with the mounting holes 120, the mounting apertures 146 and the coil 151 aligned with each other. A mounting shaft 160 is extended through the mounting holes 120, mounting apertures 146, and the coil 151, thereby attaching the connecting body 140 and the spring 150 to the pressing body 111. One end part 152 of the spring 150 abuts the top wall 112 of the pressing body 111, and the other end part 152 of the spring 150 abuts the top plate 141 of the connecting body 140, whereupon the connecting body 140 is biased by the spring 150. The protrusions 138 of the second leg 130 are extended into the respective mounting apertures 148 of the connecting body 140, thereby rotatably attaching the second leg 130 to the connecting body 140. Thus, the retaining clip 110 is fully assembled Referring to FIG. 9, assembly of the heat sink mounting assembly of the further alternative embodiment is similar to that of the preferred embodiment. The difference is that, when the operation tab 134 is pressed downwardly, the second leg 130 drives the connecting body 140 to rotate about the mounting shaft 160, thereby compressing the coil 151 of the spring, and when the second leg 130 is released, the connecting body 140 is rotated back by decompression of the coil 151, thereby driving the second leg 130 upwardly to resiliently engaged with the ear 92 of the CPU socket 90

It is understood that the invention may be embodied in other forms without departing from the spirit thereof. The above-described examples and embodiments are to be considered in all respects as illustrative and not restrictive, and the invention is not to be limited to the details given above.

What is claimed is:

1. A mounting assembly for a heat sink, the mounting assembly comprising:
    a retention device comprising a first side, and an opposite second side; and
    a retaining clip cooperating with the retention device for sandwiching the heat sink therebetween, the retaining clip comprising:
        a pressing body adapted for pressing the heat sink, the pressing body having a first end, and an opposite second end;
        a first leg extending from the first end of the pressing body and engaging with the first side of the retention device;
        a second leg located at the second end of the pressing body; and
        means for providing a biasing force to the second leg to allow it to resiliently engage with the second side of the retention device.

2. The mounting assembly as described in claim 1, wherein the pressing body is elongated, and comprises a top wall, and a pair of sidewalls extending from opposite long sides of the top wall.

3. The mounting assembly as described in claim 2, wherein each of the sidewall comprises an abutting tab adapted for urging the heat sink.

4. The mounting assembly as described in claim 2, wherein the means comprises a spring attached to the sidewalls, and the spring comprises a coil, and first and second end parts extending from the coil in opposite directions, the first end part abutting an underside of the top wall.

5. The mounting assembly as described in claim 4, wherein the top wall defines an opening at the second end thereof movably receiving the second leg therein, and the second leg comprises a medial portion, and an operation tab extending from the medial portion.

6. The mounting assembly as described in claim 5, wherein the medial portion comprises a latch engaging with the second end part of the spring, whereby the second leg is biased by the spring.

7. The mounting assembly as described in claim 5, wherein the medial portion comprises a protrusion extending from a long side thereof, the protrusion being for engaging with an underside of one the sidewalls to define an upmost position of the second leg.

8. The mounting assembly as described in claim 4, further comprising a connecting body rotatably attached to the second end of the pressing body, and the second end part of the spring abuts the connecting body, whereby the connecting body is biased by the spring.

9. The mounting assembly as described in claim 8, wherein the second leg is rotatably attached to a free end of the connecting body.

10. The mounting assembly as described in claim 9, wherein the connecting body defines a pair of mounting apertures in the free end thereof, and the second leg comprises a pair of protrusions extending into the mounting apertures respectively.

11. The mounting assembly as described in claim 9, wherein the second leg further comprises an operation tab extending therefrom.

12. The mounting assembly as described in claim 1, wherein the retention device comprises a socket adapted for mounting a heat generating component.

13. The mounting assembly as described in claim 1, wherein the retention device comprises a retention module adapted for receiving the heat sink.

14. A retaining clip for a heat sink, comprising:
an elongated pressing body extending along a first direction, the pressing body having a first end and a second end;
a first leg extending from the first end of the pressing body along a second direction that is substantially perpendicular to the first direction;
a movable member attached to the second end of the pressing body; and
a biasing member attached to the pressing body and biasing the movable member in a third direction when the movable member is moved in the second direction, the third direction being opposite to the second direction.

15. The retaining clip of claim 14, wherein the biasing member comprises a spring, the spring comprises a coil, and first and second end parts extending from the coil in opposite directions, and the first end part abuts an underside of the pressing body.

16. The retaining clip of claim 15, wherein the pressing body defines an opening at the second end thereof, the movable member comprises a second leg movably received in the opening and engaged with the second end part.

17. The retaining clip of claim 15, wherein the movable member comprises a connecting body rotatably attached to the second end of the pressing body, and a second leg attached to the connecting body, and the second end part of the spring abuts an underside of the connecting body.

18. A mounting assembly for a heat sink, the mounting assembly comprising:
a retention device comprising a first side, and an opposite second side; and
a retaining clip cooperating with the retention device for sandwiching the heat sink therebetween, the retaining clip comprising:
a pressing body adapted for pressing the heat sink, the pressing body having a first end, and an opposite second end;
a first leg extending from the first end of the pressing body and engaging with the first side of the retention device;
a second leg moveably located at the second end of the pressing body; and
a biasing device discrete from said pressing body and said second leg for providing a biasing force to the second leg to urge said second leg to be constantly lifted upwardly so as to resiliently engage with the second side of the retention device.

19. The assembly of claim 18, wherein said second leg is directly actuated by said biasing device.

20. The assembly of claim 18, wherein said second leg is pivotally mounted to connecting body which is pivotally connected to the pressing body, and the biasing device respectively urge said pressing body and said connecting body.

* * * * *